US012733516B2

(12) United States Patent
Chen et al.

(10) Patent No.: US 12,733,516 B2
(45) Date of Patent: Sep. 8, 2026

(54) SEMICONDUCTOR PACKAGE WITH EXPOSED ELECTRICAL CONTACTS

(71) Applicant: STMICROELECTRONICS PTE LTD, Singapore (SG)

(72) Inventors: Yong Chen, Singapore (SG); David Gani, Singapore (SG)

(73) Assignee: STMICROELECTRONICS PTE LTD, Singapore (SG)

(*) Notice: Subject to any disclaimer, the term of this patent is extended or adjusted under 35 U.S.C. 154(b) by 752 days.

(21) Appl. No.: 18/153,937

(22) Filed: Jan. 12, 2023

(65) Prior Publication Data

US 2023/0230949 A1 Jul. 20, 2023

Related U.S. Application Data

(60) Provisional application No. 63/301,438, filed on Jan. 20, 2022.

(51) Int. Cl.

| | |
|---|---|
| ***H10W 70/60*** | (2026.01) |
| ***H10W 72/00*** | (2026.01) |
| ***H10W 72/20*** | (2026.01) |
| *H10W 90/00* | (2026.01) |

(52) U.S. Cl.

CPC ........... *H10W 70/60* (2026.01); *H10W 72/20* (2026.01); *H10W 72/851* (2026.01); *H10W 72/07253* (2026.01); *H10W 72/234* (2026.01); *H10W 72/853* (2026.01); *H10W 90/00* (2026.01); *H10W 90/724* (2026.01)

(58) Field of Classification Search

CPC ......... H01L 24/24; H01L 24/16; H01L 24/73; H01L 2224/16058; H01L 2224/16059; H01L 2224/16227; H01L 2224/16238; H01L 2224/2402; H01L 2224/2405; H01L 2224/24226; H01L 2224/73209; H01L 2924/35121; H01L 24/20

USPC .......................................................... 257/786

See application file for complete search history.

(56) References Cited

U.S. PATENT DOCUMENTS

| | | | |
|---|---|---|---|
| 7,060,535 | B1 | 6/2006 | Sirinorakul et al. |
| 8,569,112 | B2 | 10/2013 | Do et al. |
| 8,629,567 | B2 | 1/2014 | Do et al. |

(Continued)

FOREIGN PATENT DOCUMENTS

| | | |
|---|---|---|
| CN | 202917473 U | 5/2013 |

*Primary Examiner* — Norman D Richards
*Assistant Examiner* — Laura M Dykes
(74) *Attorney, Agent, or Firm* — Seed Intellectual Property Law Group LLP

(57) ABSTRACT

A semiconductor package includes a die and a first lamination layer on the die with openings through the first lamination layer. A redistribution layer is on the first lamination layer and extends through the openings to the die. A plurality of conductive extensions are on the redistribution layer with each stud including a first surface on the redistribution layer, a second surface opposite to the first surface, and a sidewall between the first surface and the second surface. A second lamination layer is on the redistribution layer and the first lamination layer with the die encapsulated in molding compound. The second lamination layer is removed around the conductive extensions to expose the second surface and at least a portion of the sidewall of each stud to improve solder bond strength when mounting the package to a circuit board.

15 Claims, 7 Drawing Sheets

(56) References Cited

U.S. PATENT DOCUMENTS

| | | | | |
|---|---|---|---|---|
| 8,994,156 | B2 | 3/2015 | Chiang et al. | |
| 10,242,934 | B1 | 3/2019 | Sirinorakul | |
| 11,049,843 | B2 | 6/2021 | Celaya et al. | |
| 2012/0006592 | A1* | 1/2012 | Ouchi | H01L 24/03 174/267 |
| 2014/0097536 | A1 | 4/2014 | Schunk | |
| 2015/0294949 | A1* | 10/2015 | Lin | H01L 23/49816 257/738 |
| 2016/0079191 | A1 | 3/2016 | Chen et al. | |
| 2017/0229322 | A1 | 8/2017 | Hsu et al. | |
| 2022/0102256 | A1* | 3/2022 | Kwon | H01L 24/05 |
| 2022/0406702 | A1* | 12/2022 | Lee | H01L 21/4857 |

* cited by examiner

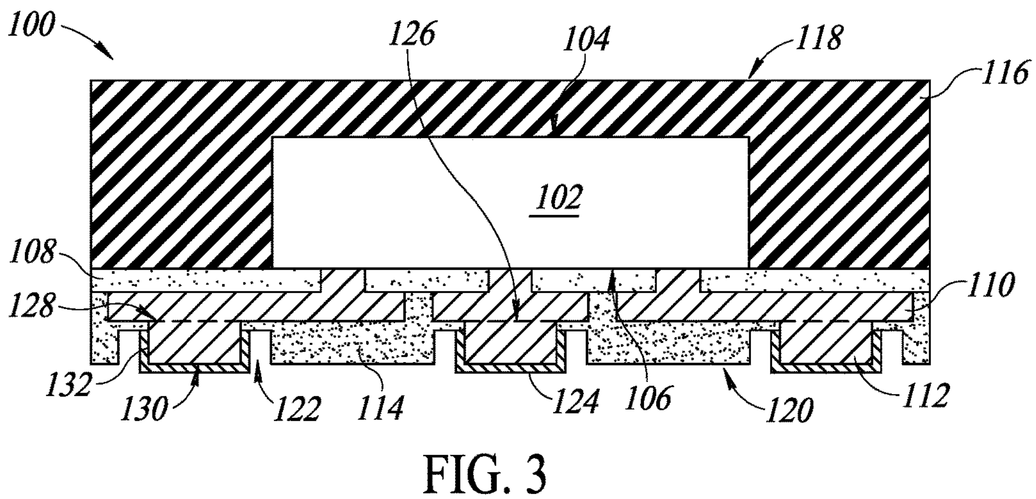
FIG. 3
100
102
114
110
132
138
140
136
130
122
124
140
112
FIG. 4
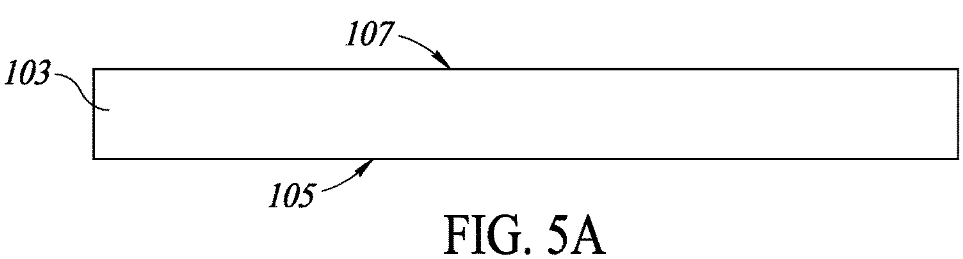
FIG. 5A

SEMICONDUCTOR PACKAGE WITH EXPOSED ELECTRICAL CONTACTS

BACKGROUND

Technical Field

The present disclosure is directed to a semiconductor package, and more particularly, to a semiconductor package with exposed electrical contacts.

Description of the Related Art

A typical semiconductor package includes integrated circuits on a die that is encapsulated in molding compound. The package includes mounting studs electrically connected to the die with only one surface of the studs exposed on an outer surface of the package. The studs on the package enable a connection between integrated circuits on the die and a printed circuit board. In many cases, the package is physically and electrically connected to pads on the circuit board with solder between the pads on the circuit board and the studs of the package. However, due to scaling demands of integrated circuits and packages generally, the mounting studs of packages have become smaller and smaller as packages become smaller. The decrease in size of the exposed mounting studs on known packages results in only a small surface area available for soldering. As a result, known packages have a weak connection with solder that results in a number of disadvantages.

For example, cracks can form in the soldered connection between the package and the board and result in an electrical disconnection between the mounted package and the circuit board. The electrical disconnection renders the package inoperative for its intended purpose. In addition to cracking, the package can separate from the board if the soldered connections fail. As a result, known packages have reliability and performance issues that may occur because of the disadvantages with traditional structures and methods for connecting the package to the board. It would therefore be desirable to have a semiconductor package that overcomes the above disadvantages.

BRIEF SUMMARY

A semiconductor package described herein generally includes a semiconductor die with an active surface and an inactive surface opposite to the active surface. A first lamination or dielectric layer is on the active surface of the die with a plurality of vias or openings formed through the first lamination layer to expose portions of the active surface of the die. A redistribution layer, which is typically copper or another like metal, is on the first lamination layer and extends through the vias to the active surface of the die. Then, electrical contacts or mounting studs are formed on the redistribution layer. The mounting studs may likewise be copper or another metal to create an electrical path from the studs, through the redistribution layer, and to the active surface of the die. Each of the studs includes a first surface on the redistribution layer, a second surface opposite to the first surface, and a sidewall between the first and second surfaces.

A second lamination layer is deposited on the redistribution layer and the first lamination layer with the second lamination layer initially surrounding the studs. The second lamination layer is ground down to expose the second surface of the studs. Further, channels or apertures are cut or etched into the second lamination layer around the studs to expose a selected amount of the sidewall of the studs. In some examples, a plating layer is formed over the exposed portion of the studs to protect against oxidation and corrosion. Molding compound encapsulates the inactive surface of the die and the first lamination layer to complete the package.

The package can then be physically and electrically coupled via the exposed studs to electrical contacts on a printed surface board with solder. Specifically, the solder is connected to the exposed mounting studs of the package and the contacts on the board. Because the sidewalls of the mounting studs are exposed, there is more surface area on the studs for connection to the solder. The increase in surface area results in a stronger bond between the studs and the solder, which in turn, results in a stronger bond between the package and the board that is less likely to crack and separate and therefore overcomes the above disadvantages of known packages described above.

BRIEF DESCRIPTION OF THE SEVERAL VIEWS OF THE DRAWINGS

The present disclosure will be more fully understood by reference to the following figures, which are for illustrative purposes only. These non-limiting and non-exhaustive embodiments are described with reference to the following drawings, wherein like labels refer to like parts throughout the various views unless otherwise specified. The sizes and relative positions of elements in the drawings are not necessarily drawn to scale in some figures. For example, the shapes of various elements are selected, enlarged, and positioned to improve drawing legibility. In other figures, the sizes and relative positions of elements in the drawings are exactly to scale. The particular shapes of the elements as drawn may have been selected for ease of recognition in the drawings. The figures do not describe every aspect of the teachings disclosed herein and do not limit the scope of the claims.

FIG. 3 is a cross-sectional view of the semiconductor package of FIG. 2 along line A-A in FIG. 2;

FIG. 4 is a cross-sectional view of the semiconductor package of FIG. 2 mounted to a printed circuit board;

FIGS. 5A-5L are cross-sectional views of steps in an embodiment of a manufacturing process for a semiconductor package according to the present disclosure;

DETAILED DESCRIPTION

Persons of ordinary skill in the art will understand that the present disclosure is illustrative only and not in any way limiting. Other embodiments of the presently disclosed system and method readily suggest themselves to such skilled persons having the assistance of this disclosure.

Each of the features and teachings disclosed herein can be utilized separately or in conjunction with other features and teachings to form variations on such packages. Representative examples utilizing many of these additional features and teachings, both separately and in combination, are described in further detail with reference to attached FIGS. 1-9. This detailed description is merely intended to teach a person of skill in the art further details for practicing aspects of the present teachings and is not intended to limit the scope of the claims. Therefore, combinations of features disclosed in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present system and method. However, it will be apparent to one skilled in the art that these specific details are not required to practice the teachings of the present devices, systems and methods.

Figure 1:
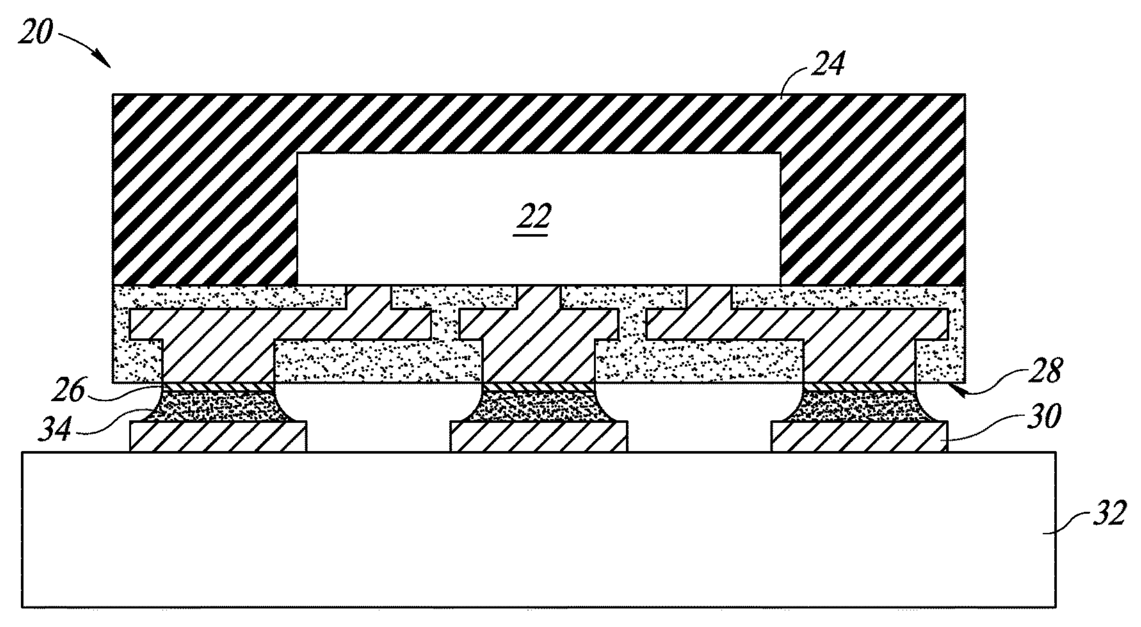
FIG. 1 is a cross-sectional view of a known semiconductor package.

FIG. 1 illustrates a known semiconductor package 20 to provide additional context for the advantages of the embodiments present disclosure. The package 20 includes a die 22 encapsulated with molding compound 24. The die 22 is in electric communication with contacts 26 on a bottom surface 28 of the package 20. The contacts 26, in turn, are coupled to pads 30 on a circuit board 32 with solder 34 to establish an electrical connection between the die 22 and the board 32. As shown in FIG. 1, the contacts 26 may be coplanar with, or may extend slightly beyond, the bottom surface 28 of the package 20. Thus, the only surface area of the contacts 26 that is available for bonding to the solder 34 is the exposed bottom surface of the contacts 26 at the bottom of the package 20. Because the exposed surface of the contacts 26 is a small area, it is difficult to establish a strong bond between contacts 26 and the solder 34. In other words, the relatively small exposed surface area of the contacts 26 leads to a weak bond with solder 34 that is prone to cracking. Cracks in the solder 34 can lead to an electrical disconnection between the package 20 and the circuit board 32, rendering the package 20 inoperative. Further, the package 20 may completely separate from the board 32 if the soldered connection fails. Thus, known packages have reliability and performance issues that can result from the soldered connection between the package 20 and the circuit board 32.

In contrast, the present disclosure is generally directed to a semiconductor package with exposed electrical contacts that increase the surface area for bonding with solder when the package is mounted to a printed circuit board. As will be described in greater detail below, the sidewalls of the contacts are exposed to significantly increase the surface area available for bonding with the solder. The increase in available surface area enables a stronger bond between the package and the solder, which in turn, reduces the likelihood of cracking or separation. Thus, the concepts of the present disclosure improve the reliability and expected useful lifecycle of semiconductor packages.

Figure 2:
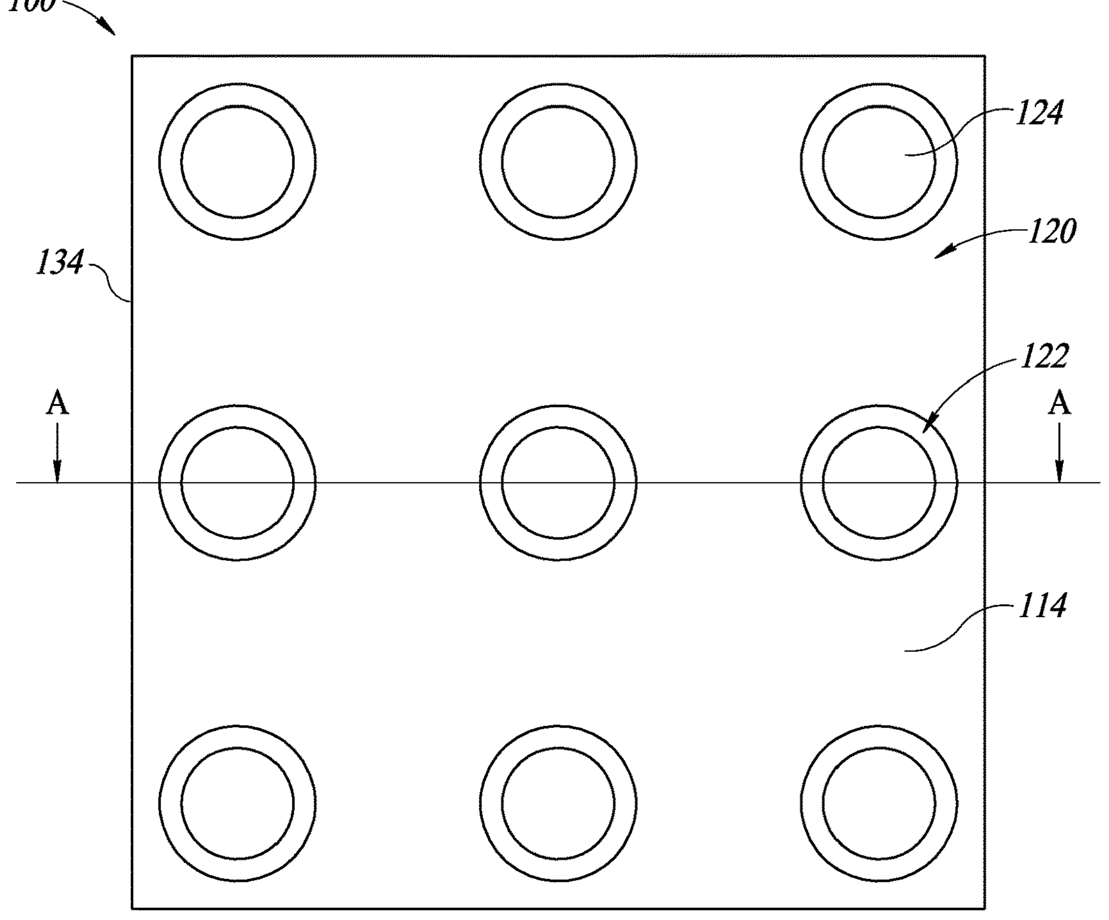
FIG. 2 is a bottom plan view of an embodiment of a semiconductor package with exposed mounting studs according to the present disclosure.

FIG. 2 is a bottom plan view of an embodiment of a semiconductor package 100 according to the present disclosure. FIG. 3 is a cross-sectional view of the package 100 along line A-A in FIG. 2. Beginning with FIG. 3, the package 100 includes a die 102 with a first or inactive surface 104 and a second or active surface 106 opposite to the first surface 104. The die 102 may be any semiconductor material, such as silicon in a non-limiting example, and includes integrated circuits formed in or on the second surface 106. A first lamination layer 108 is on the second surface 106 of the die 102. As described in greater detail below, a plurality of vias or openings 109 (FIG. 5C) extend through the first lamination layer 108 to enable an electrical connection through the package 100 to the die 102. A redistribution layer 110 is on the first lamination layer 108 and extends through the vias 109 (FIG. 5C) to the first surface 104 of the die 102. A plurality of electrical contacts 112 (which may also be referred to herein as a plurality of mounting studs or conductive extensions or contact pads 112 or a plurality of studs 112) are formed on the redistribution layer 110. A second lamination layer 114 is disposed on the redistribution layer 110 and is on at least a portion of the contacts 112 in some embodiments. The redistribution layer 110 and the plurality of contacts 112 are copper in some non-limiting examples, although a different metal or metal alloy can be selected for the redistribution layer 110 and the contacts 112. Further, the lamination layers 108, 114 may be a Build-up Film or any other insulating or dielectric material.

The die 102 and the first lamination layer 108 are encapsulated with molding compound 116 to complete the package 100. Specifically, the molding compound 116 is on the first or inactive surface 104 of the die 102 and may be selected from any number of commercial available products. Thus, the package 100 has a first or top surface 118 and a second or bottom surface 120 opposite to the first surface 118. In some embodiments, the molding compound 116 defines the boundaries of the first surface 118 of the package 100 and the second lamination layer 114 defines the boundaries of the second surface 120 of the package 100. The second surface 120 of the package 100 is illustrated in more detail in FIG. 2.

The package 100 further includes a plurality of channels or recesses 122 extending into the second lamination layer 114 around the plurality of contacts 112. The second lamination layer includes internal sidewalls that face the contact 112. A gap or space is between the internal sidewalls of the lamination layer and the sidewalls of the contact 112.

Further, a plating or conductive layer 124 is disposed or formed on each of the contacts 112. The plating layer 124 may be a nickel gold alloy, or any other selected metal or metal alloy. The plating layer 124 prevents oxidation or corrosion of the contacts 112 and in some embodiments, the material for the plating layer 124 may be selected to improve adhesion to solder compared to the copper material of the contacts 112. While the plating layer 124 is not necessarily required in the package 100, the plating layer 124 is included in a preferred embodiment to prevent oxidation and improve the reliability and useful lifecycle of the package 100. Dashed lines 126 in FIG. 3 represent an interface between the contacts 112 and the redistribution layer 110. In practice, there may be a visible line between these structures because the contacts 112 are formed on the redistribution layer 110 in a separate manufacturing step described below. However, for simplicity in the drawings, this line is represented by dashed lines 126.

The contacts 112 have a first or top surface 128 and a second or bottom surface 130 opposite to the first surface 128. As shown in FIG. 3, the first surface 128 of each of the contacts 112 is on the redistribution layer 110. The second surface 130 is spaced from the first surface 128 across a sidewall 132 of the contacts 112. In other words, the sidewall 132 of each of the contacts 112 extends between the first surface 128 and the second surface 130 of each of the contacts 112.

The plating layer 124 is on the second surface 130 and at least a portion of the sidewall 132 of each of the contacts 112. Although the plating layer 124 is illustrated as being on a majority of the sidewall 132 of each contact 112 in FIG. 3, other configurations are possible and are described in more detail herein. Thus, in some embodiments, the plating layer 124 and the second lamination layer 114 define the plurality of channels 122. Because the plating layer 124 is preferably metal or a metal alloy, solder can form a strong bond with the plating layer 124. Moreover, at least a portion of the sidewall 132 of each of the contacts 112 is exposed through a corresponding channel 122 to increase the surface area for bonding with the solder. As above, the increased surface area results in a stronger bond relative to known packages. In some embodiments, the second surface 130 of the contacts 112 is coplanar with, or recessed with respect to, an outer surface of the second lamination layer 114. Thus, the contacts 112 may not protrude from, or extend beyond, the second surface 120 of the package 100, but rather, are internal to the package 100 except as otherwise exposed to an external environment through channels 122. In some embodiments, only the plating layer 124 protrudes from the second surface 120 of the package 100.

Turning back to FIG. 2 in view of the context above, the bottom surface 120 of the package 100 is illustrated in FIG. 2 in a plan view. The second lamination layer 114 defines the bottom surface 120 of the package 100 in some embodiments and is therefore visible in FIG. 2. Further, the package 100 includes the plating layer 124 on contacts 112 (FIG. 3) and the plurality of channels 122 in the second lamination layer 114 and extending around the contacts 112 (FIG. 3). As shown in FIG. 2, the channels 122 may extend around an entirety of the perimeter of the plating layer 124. Thus, the channels 122 may likewise extend around an entirety of the perimeter of the contacts 112 in some embodiments. Further, the plating layer 124 is on an entirety of the second surface 130 (FIG. 3) of the contacts 112 and extends around an entire perimeter or outer surface of at least a portion of the sidewall 132 (FIG. 3) of each contact 112 exposed through channels 122.

Further, the contacts 112 (FIG. 3) and the plating layer 124 on the contacts 112 may generally be round or cylindrical as shown in FIG. 2, or they may have a different selected shape, as described herein. The package 100 may have an outermost edge or perimeter 134 in the shape of a square or rectangle, although the same is not necessarily required and the package 100 may have any selected shape. Although FIG. 2 illustrates nine contacts 112 (FIG. 3) arranged in rows and columns that are spaced equidistant from each other for simplicity, the package 100 in practice may include many more or less than nine contacts 112 (FIG. 3) in any selected special arrangement.

FIG. 4 illustrates a cross-sectional view of the package 100 coupled to a printed circuit board 136 (which may also be referred to herein as a circuit board 136 or a board 136). The board 136 includes a plurality of contacts 138 on a mounting surface 140 of the board 136. The package 100 is physically and electrically coupled to the board 136 by solder 140. In particular, the solder 140 bonds to the plating layer 124 on the contacts 112 and the contacts 138 on the board 136. Thus, there is an electrical path through the board 136 to the contacts 138 on the board 136, through the solder 140 to the plating layer 124, from the plating layer 124 to the contacts 112 of the package 100, through the redistribution layer 110 and to the die 102. As shown in FIG. 4, the solder 140 extends into the channels 122 in the second lamination layer 114 of the package 100 and contacts the plating layer 124 on the portion of each sidewall 132 of the contacts 112 that is exposed through the channels 122. Due to variations in mounting the package 100 on the board 136 or design factors, the solder 140 may contact any portion of the plating layer 124 on the portion of the sidewall 132 of each contact 112 that is exposed through the channels 122. For example, the solder 140 may contact the plating layer 124 on the entirety of the exposed portion of the sidewall 132, approximately half the exposed portion of the sidewall 132, or less than half the exposed portion of the sidewall 132 in some embodiments.

Further, FIG. 4 demonstrates that the channels 122 extend into the second lamination layer 114 to a depth that is greater than a majority of a height of the sidewalls 132 of the contacts 112 in some embodiments. Thus, the plating layer 124 is on a majority of a total surface area of the contacts 112 (i.e., on the second surface 130 of the contacts 112 and more than half the height of the sidewalls 132 of the contacts 112) with a minority portion of the surface area of the contacts 112 covered by the second lamination layer 114. As a result, the solder 140 can bond with a majority of the surface area of the contacts 112 (or plating layer 124 on the majority of the surface area of the contacts 112), which improves the bond strength relative to known packages.

FIGS. 5A-5L are cross-sectional views of steps in an embodiment of a manufacturing process for the semiconductor package 100 described above with reference to FIGS. 2-4. The process begins in FIG. 5A with a wafer or a substrate 103 that may be a selected semiconductor material, such as silicon in one non-limiting example. The wafer 103 includes a first or inactive surface 105 and a second or active surface 107 opposite to the first surface 105. Then, in FIG. 5B, the first lamination layer 108 is deposited or applied to the second surface 107 of the wafer 103. A plurality of vias 109 are formed through the first lamination layer 108 to selectively expose portions of the second surface 107 of the wafer 103. The vias 109 extend through an entirety of the first lamination layer 108 at selected locations and may be formed by cutting the first lamination layer 108 with a laser drill, by etching, or with any other selected technique.

Figure 5B:
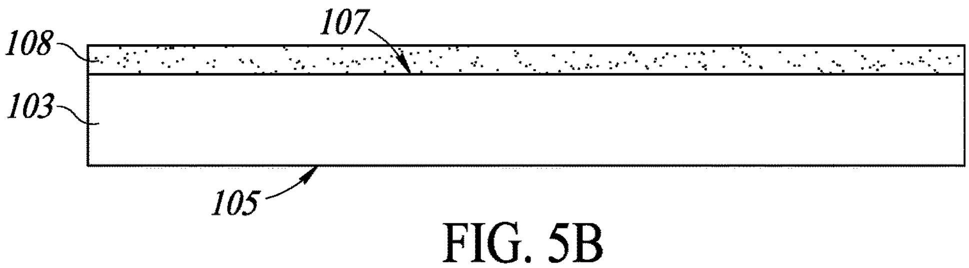
Figure 5C:
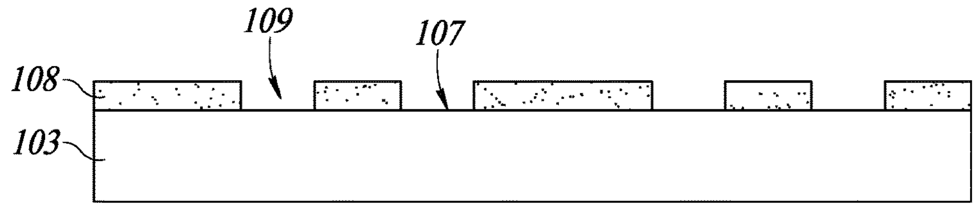
Figure 5D:
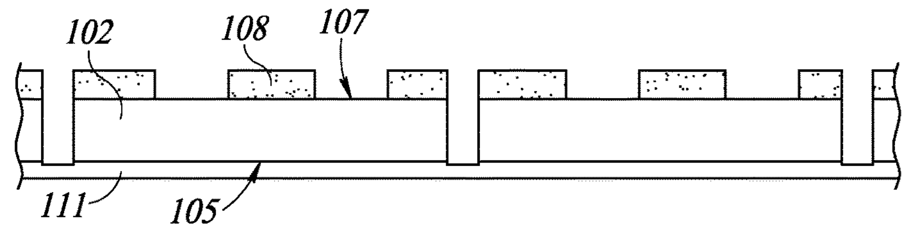
Figure 5E:
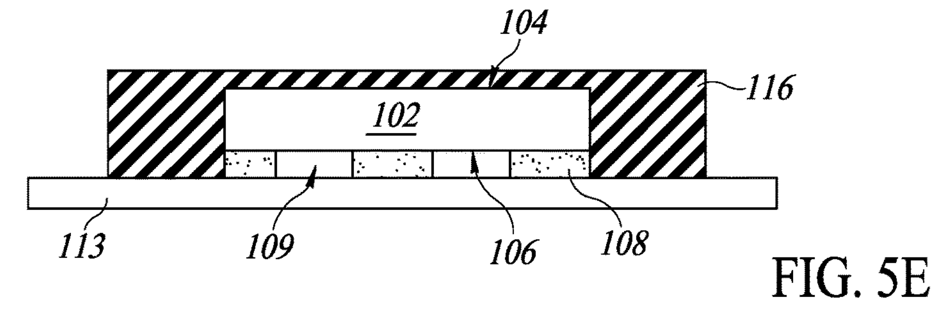

In FIG. 5D, a grinding operation is performed on the first surface 105 of the wafer 103 to reduce the thickness of the wafer 103. Then, a tape 111 is applied to the first surface 105 of the wafer 103 to provide support to the wafer 103 during singulation. After the tape 111 is applied, a first phase of the singulation process is performed. This creates openings between adjacent die 102. The wafer 103 is separated into individual die 102 by cutting, dicing, or other singulation techniques down to the tape 111, see FIG. 5D. The tape 111 is removed after singulation in FIG. 5D and the die 102 are inverted and placed on a first carrier 113 as in FIG. 5E. In particular, the die 102 is positioned with the first lamination layer 108 on the first carrier 113. Molding compound 116 is deposited on the die 102 to encapsulate the die 102. More specifically, the molding compound 116 encapsulates the first surface 104 of the die 102 and the first lamination layer 108. The molding compound 116 initially has a greater thickness above the first surface 104 of the die 102, but after the molding compound 116 cures, a grinding step is performed to reduce the thickness of the molding compound 116 to the thickness shown in FIG. 5E. The first carrier 113 prevents the molding compound 116 from filling the vias 119 and contacting the second or active surface 106 of the die 102.

Figure 5F:
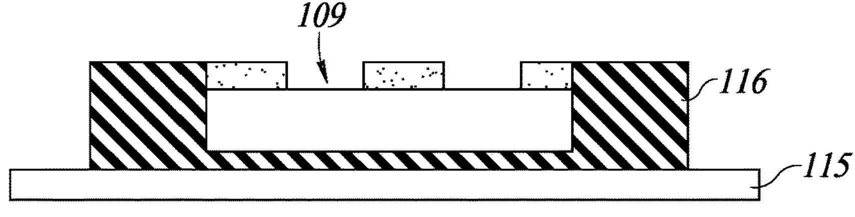
Figure 5G:
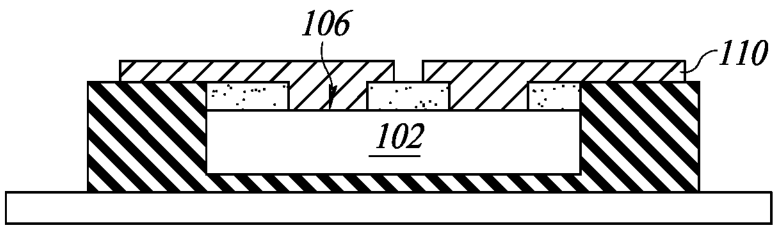
Figure 5H:
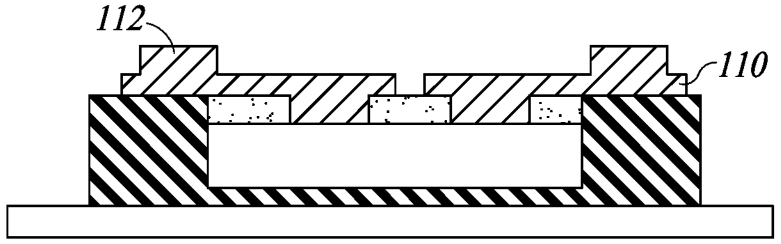
Figure 5I:
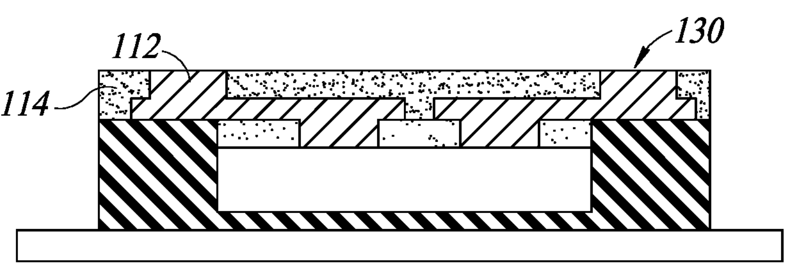

In FIG. 5F, the assembly to this stage is inverted and the molding compound 116 is placed on a second carrier 115, which may also be referred to as a transfer carrier 115. The assembly is inverted to the position shown in FIG. 5F to expose the vias 109 and enable formation of the remaining components of the package 100, as described below. In FIG. 5G, a pattern is applied and the redistribution layer 110 is plated on the die 102. As shown in FIG. 5G, the redistribution layer 110 fills the plurality of vias 109 (FIG. 5F) and is in direct contact with the second surface 106 of the die 102 through the vias 109 (FIG. 5F). Then, in FIG. 5H, a second pattern is applied and the contacts 112 (which may also be referred to herein as mounting studs 112 or studs 112) are plated in selected locations on the redistribution layer 110. The second lamination layer 114 is then deposited over the redistribution layer 110 and the contacts 112 as in FIG. 5I. In some embodiments, the second lamination layer 114 is deposited without patterning, or in other words, the second lamination layer 114 initially covers the contacts 112. In a subsequent grinding step, the thickness of the second lamination layer 114 is reduced to expose the outer surface of the contacts 112 as shown in FIG. 5I. In particular, the second lamination layer 114 is ground down until the second surface 130 of the contacts 112 is exposed. The second lamination layer 114 may be also deposited with a pattern corresponding to the second surface 130 of the contacts 112 in one or more embodiments.

Figure 5J:
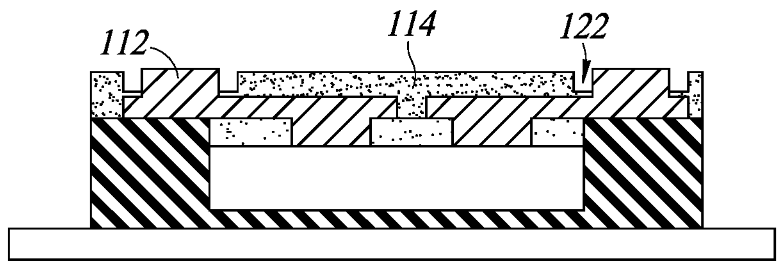

In FIG. 5J, the channels 122 are formed around the contacts 112. In some embodiments, the channels 122 are cut to a selected depth in the second lamination layer 114 with a laser drill. However, the channels 122 may also be formed by other selected techniques, such as masking or patterning and plasma etching in one non-limiting example. While the channels 122 are generally illustrated as having a square or rectangular shape with vertical sidewalls, it is to be appreciated that in practice, the channels 122 may have an uneven shape from the laser drill or a sloped shape with chamfered or rounded step-down edges due to etching. Thus, the shape of the channels 122 in the appended figures is merely for ease of recognition and the present disclosure is not limited to the particular illustrated shapes.

Figure 5K:
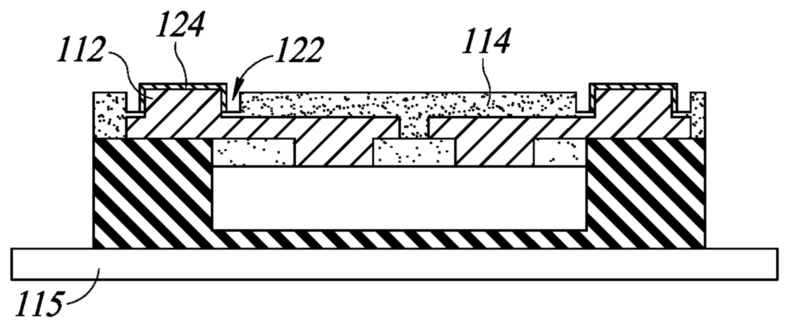
Figure 5L:
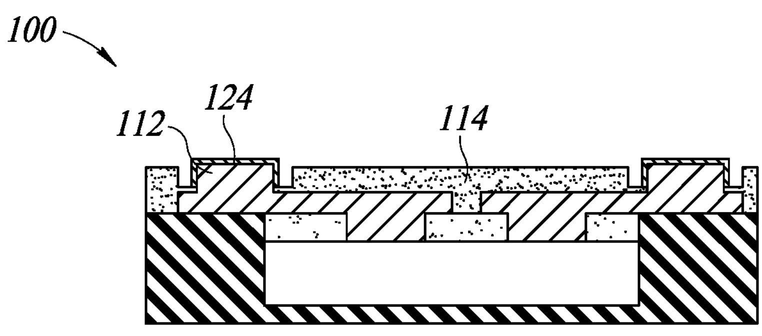

In FIG. 5K, the plating layer 124 is applied to the contacts 112 through any selected technique, such as electroless plating in one non-limiting example. The plating layer 124 covers the entire exposed surface of the contacts 112 (i.e., the entire area of the contacts extending beyond the second lamination layer 114 and exposed by the channels 122). Finally, in FIG. 5L, the assembly is separated from the second carrier 115 (FIG. 5K) and singulated from other packages to complete the package 100. In other words, although the figures show only one package 100, the molding compound 116 and other features may be repeated to simultaneously form multiple packages 100 on the same carriers 113, 115. In FIG. 5J, a grinding or sawing operation is performed to separate each individual package 100 from the array of packages 100. Each package 100 is then packed for further transport and can be mounted to a circuit board, as described herein, in a subsequent step prior to activation or use of the package 100. While not shown in FIGS. 5A-5K, it is to be appreciated that the process above may include forming integrated circuits in or on the second surface 107 of the wafer 103 such that the second surface 106 of the die 102 likewise includes integrated circuits therein or thereon for carrying out operational functions of the die 102 and the package 100 generally.

The above description is related to one or more embodiments of the manufacturing process for the package 100. However, it is to be appreciated that many aspects of the process or the package 100 can be selected according to design factors. For example, the contacts 112 are illustrated as being coplanar and aligned with the second lamination layer 114 such that the plating layer 124 extends beyond the second lamination layer 114 to form a raised surface on the package 100 in some embodiments. In one or more embodiments, the plating or cutting depths described above can be selected such that the contacts 112 may be recessed with respect to, or extend beyond the second lamination layer 114 so that the plating layer 124 is likewise recessed relative to, coplanar and aligned with, or extends beyond the second lamination layer 114. In yet further embodiments, one or more steps may be combined or omitted. The above variations are a few non-limiting examples of potential variations to the package 100 based on adjustments to the manufacturing process that are contemplated within the scope of the disclosure.

Figure 6:
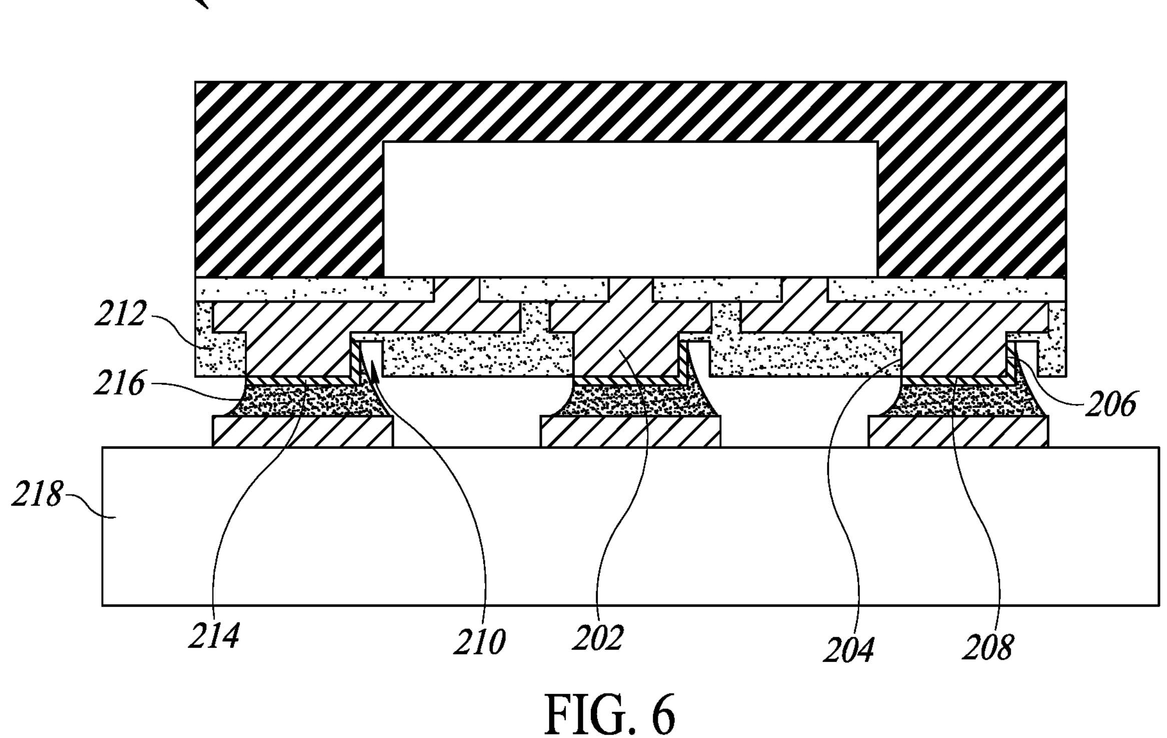
FIG. 6 is a cross-sectional view of an embodiment of a semiconductor package with partially exposed mounting studs according to the present disclosure.

FIG. 6 is a cross-sectional view of an embodiment of a semiconductor package 200 with partially exposed mounting studs. The package 200 includes mounting studs 202 having a first side 204 and a second side 206 opposite to the first side 204. An outermost surface 208 of the studs 202 interfaces with the first and second sides 204, 206 with the sides 204, 206 being on opposite sides of the surface 208. The package 200 further includes a plurality of apertures or holes 210 in a lamination layer 212 of the package 200 to expose a portion of the studs 202.

In particular, the apertures 210 may be formed to a selected depth and width in the lamination layer 212 on only one side, such as only the first side 204 or the second side 206 of each of the studs 202. Thus, in some embodiments, the apertures 210 expose only a half of the studs 202. The other side or half of the studs 202 is covered with the lamination layer 212. As a result, the package 200 includes a plating layer 214 on the outermost surface 208 and only one of the sides 204, 206 of the studs 202. The package 200 in FIG. 6 increases the available surface area for bonding with solder 216 during mounting to a board 218 relative to known packages, but demonstrates that the package 200 does not necessarily require the apertures 210 to extend around an entirety of the studs 202 in some embodiments.

Figure 7:
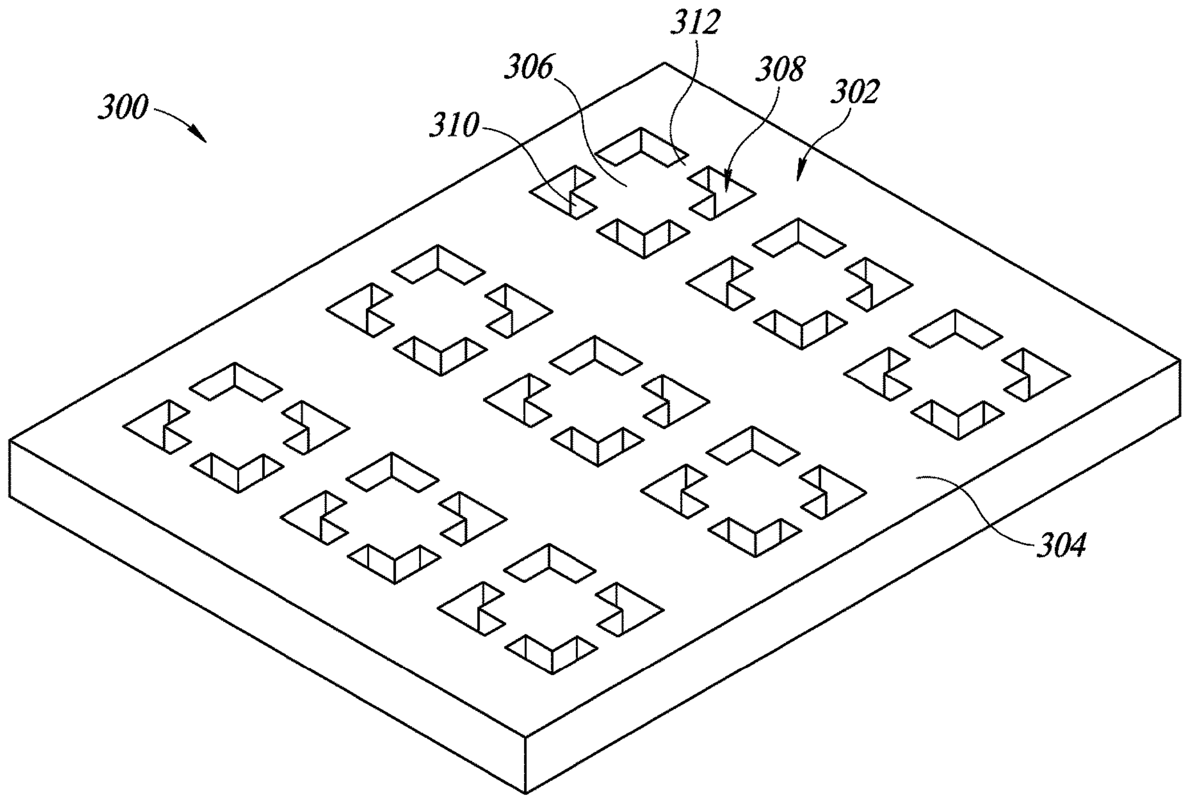
FIG. 7 is an isometric view of an embodiment of a semiconductor package with partially exposed mounting studs according to the present disclosure.

Similarly, FIG. 7 is an isometric view of an embodiment of a semiconductor package 300 with partially exposed mounting studs. In particular, the package 300 includes a bottom surface 302 shown in FIG. 7 that is defined, at least in part, by a lamination layer 304. The package 300 includes a plurality of studs 306 and a plurality of openings 308 exposing portions of a sidewall 310 of the studs 306. Although FIG. 7 illustrates that there are four openings 308 spaced equidistant around the studs 306 separated by portions or bridge 312 of the lamination layer 304, the number and arrangement of the openings 308 can be selected and may be more or less than four openings with any spacing. Further, FIG. 7 illustrates that the studs 306 may be square or rectangular in some embodiments instead of circular or cylindrical. Similar to FIG. 6 and package 200, the package 300 includes partially exposed studs 306 with increased surface area for bonding with solder relative to known packages without providing a channel around an entirety of the studs 306.

Figure 8:
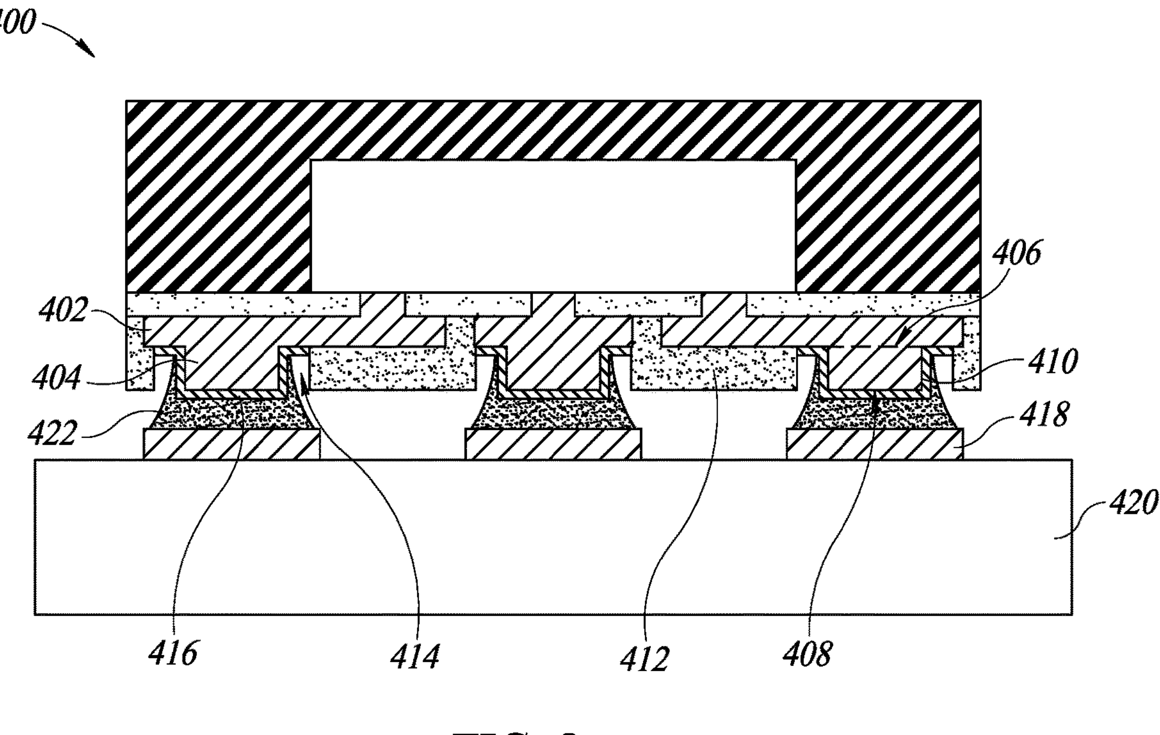
FIG. 8 is a cross-sectional view of an embodiment of a semiconductor package with sidewalls of mounting studs exposed to a redistribution layer of the package according to the present disclosure.

FIG. 8 is a cross-sectional view of an embodiment of a semiconductor package 400 with openings or channels that extend to a redistribution layer. More specifically, the package 400 includes a redistribution layer 402 and a plurality of mounting studs 404 on the redistribution layer 402. The studs 404 have a first surface 406 on the redistribution layer 402 and a second surface 408 opposite to the first surface 406 with a sidewall 410 extending between the first and second surfaces 406, 408. A lamination layer 412 is on the redistribution layer 402 with the package 400 including a plurality of openings 414 in the lamination layer 412 and extending around the studs 404. The openings 414 extend from an outer surface of the lamination layer 412 to the redistribution layer 402 in some embodiments.

A plating layer 416 is disposed on the mounting studs 404 and the redistribution layer 402. In more detail, the plating layer 416 is on the second surface 408 and entirety of the sidewall 410 of the mounting studs 404 as well as on a portion of the redistribution layer 402 on either or all sides of the studs 404. The plating layer 416 extends to terminate at the lamination layer 412. Thus, when the package 400 is mounted to contacts 418 on a circuit board 420 with solder 422, the solder 422 extends along the entirety of the sidewall 410 of the mounting studs 404 and contacts the redistribution layer 402 in some embodiments (or the plating layer 416 on the contacts 404 and the redistribution layer 402).

Figure 9:
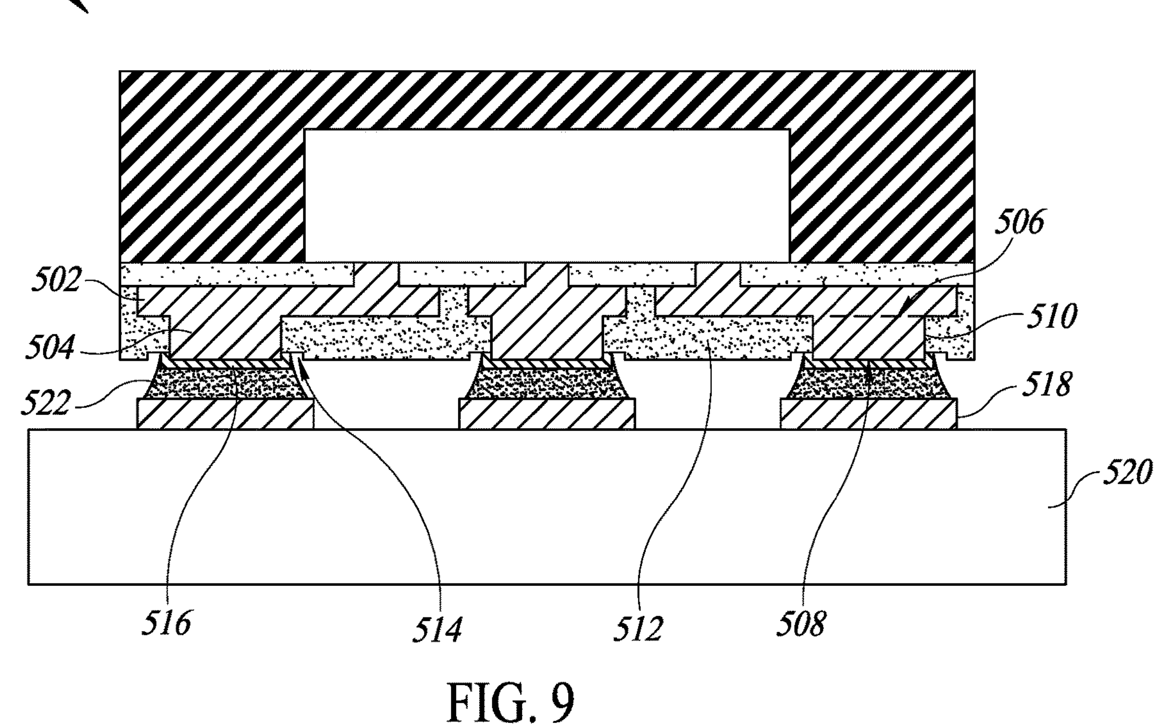
FIG. 9 is a cross-sectional view of an embodiment of a semiconductor package with sidewalls of mounting studs exposed to a depth less than a majority of a height of the sidewalls according to the present disclosure.

FIG. 9 is a cross-sectional view of an embodiment of a semiconductor package 500 with sidewalls of mounting studs exposed to a depth less than a majority of a height of the sidewalls. The package 500 includes a redistribution layer 502 and a plurality of contacts 504 on the redistribution layer 502. The contacts 504 have a first surface 506 on the redistribution layer 502 and a second surface 508 opposite to the first surface 506 with a sidewall 510 extending between the first and second surfaces 506, 508. A lamination layer 512 is on the redistribution layer 502 with the package 500 including a plurality of gaps 514 in the lamination layer 512 extending around the contacts 504. The gaps 514 extend from an outer surface of the lamination layer 512 to a distance that is less than half of a height of the sidewall 510 of the contacts 504 in some embodiments.

A plating layer 516 is disposed on the contacts 504 and terminates at the redistribution layer 502. In more detail, the plating layer 516 is on the second surface 508 and a portion of the sidewall 510 of the contacts 504 that is less than a majority of a height of the sidewall 510 of the contacts 504 as well as on a portion of the redistribution layer 502 adjacent to the contacts 504. Thus, when the package 500 is mounted to contacts 518 on a circuit board 520 with solder 522, the solder 522 extends along less than a majority of the sidewall 510 of the contacts 504 (or the plating layer 516 on the contacts 504).

As shown in the above examples in FIGS. 3, 8, and 9, the depth of the channel around the mounting studs can be selected to correspond to any portion of the sidewall. In other words, the channels may extend less than a majority of a height of the sidewall, half of the height of the sidewall, a majority of the height of the sidewall, or the entirety of the sidewall or anywhere in between. The plating layer may be likewise located on the portion of the sidewall exposed by the channel. The contacts are internal to the package, meaning that they do not protrude beyond the bottom of the package in order to reduce the package thickness while increasing surface area for bonding with, as described herein. The packages 200, 300, 400, 500 may be identical to package 100 except as otherwise described above.

In view of the above, the present disclosure is directed to a semiconductor package with exposed mounting studs to increase bonding surface area in a soldered connection between the package and a printed circuit board. The increase in bonding surface area creates a stronger physical and electrical connection between the package and the board that overcomes the disadvantages of known semiconductor packages.

One or more embodiments of a device according to the present disclosure may be summarized as including: a die having a first surface and a second surface opposite to the first surface; a first lamination layer on the first surface of the die; a plurality of vias through the first lamination layer; a redistribution layer on the first lamination layer, the redistribution layer extending through the plurality of vias to the first surface of the die; a plurality of studs on the redistribution layer, each of the plurality of studs including a first surface on the redistribution layer, a second surface opposite to the first surface, and a sidewall between the first surface and the second surface; a second lamination layer on the redistribution layer and the first lamination layer; a plurality of channels in the second lamination layer around the plurality of studs, the second surface and at least a portion of the sidewall of each of the plurality of studs being exposed to an external environment; and a molding compound on the second surface of the die and the first lamination layer.

In an embodiment, the device may further include a plating layer on the second surface and at least the portion of the sidewall of each of the plurality of studs.

In an embodiment, the plurality of channels extend to the redistribution layer.

In an embodiment, the plurality of channels have a depth that is less than a majority of a height of the sidewall of each of the plurality of studs.

In an embodiment, the plurality of channels have a depth that is greater than a majority of a height of the sidewall of each of the plurality of studs.

In an embodiment, the plurality of channels are adjacent to the sidewall of each of the plurality of studs.

In an embodiment, the plurality of channels extend around an entire perimeter of the plurality of studs.

One or more embodiments of a package may be summarized as including: a die having a first surface and a second surface opposite to the first surface; a redistribution layer in communication with the first surface of the die; a plurality of studs on the redistribution layer, each of the plurality of studs including a first surface on the redistribution layer, a second surface opposite to the first surface, and a sidewall between the first surface and the second surface; a lamination layer on the first surface of the die and on at least a portion of the redistribution layer; an aperture in the lamination layer at an interface between at least one of the plurality of studs and the lamination layer, the second surface and at least a portion of the sidewall of the at least one of the plurality of studs being exposed to an external environment through the aperture; and a molding compound on the second surface of the die and the lamination layer.

In an embodiment, the package further includes a plating layer on at least one of the plurality of studs.

In an embodiment, the plating layer is on the second surface and at least a portion of the sidewall of the at least one of the plurality of studs.

In an embodiment, the aperture has a depth that is more than a majority of a height of the sidewall of the at least one of the plurality of studs.

In an embodiment, the aperture extends around less than an entirety of a perimeter of the at least one plurality of studs.

In an embodiment, the lamination layer includes a first lamination layer between the first surface of the die and the redistribution layer and a second lamination layer on the first lamination layer and on the at least the portion of the redistribution layer, the aperture being in the second lamination layer.

One or more embodiments of a package may be summarized as including: a die having a first surface and a second surface opposite to the first surface; a plurality of studs in communication with the first surface of the die, each of the plurality of studs including a first surface, a second surface, and a sidewall between the first surface and the second surface; a lamination layer on the first surface of the die; a channel in the lamination layer, the second surface and at least a portion of the sidewall of the at least one of the plurality of studs being exposed to an external environment through the channel; and a molding compound on the second surface of the die and the lamination layer.

In an embodiment, the package includes the lamination layer including a plurality of vias, the package including a redistribution layer on the lamination layer and extending through the plurality of vias to the first surface of the die, the plurality of studs on the redistribution layer.

In an embodiment, the lamination layer includes a first lamination layer and a second lamination layer, the first lamination layer between the first surface of the die and the redistribution layer and the second lamination layer on the first lamination layer.

In an embodiment, the package further includes a plating layer on the second surface and at least a portion of the sidewall of the at least one of the plurality of studs.

In an embodiment, the channel is one of a plurality of channels around the least one of the plurality of studs, the lamination layer extending between successive ones of the plurality of channels.

In an embodiment, the channel has a depth that is greater than a majority of a height of the sidewall of the at least one of the plurality of studs.

In an embodiment, the package further includes a plating layer on the second surface and the majority of the height of the sidewall of the at least one of the plurality of studs.

In the above description, certain specific details are set forth in order to provide a thorough understanding of various embodiments of the disclosure. However, one skilled in the art will understand that the disclosure may be practiced without these specific details. In other instances, well-known structures associated with electronic components, packages, and semiconductor fabrication techniques have not been described in detail to avoid unnecessarily obscuring the descriptions of the embodiments of the present disclosure.

While various embodiments are shown and described with respect to silicon die, it will be readily appreciated that embodiments of the present disclosure are not limited thereto. In various embodiments, the structures, devices, methods and the like described herein may be embodied in or otherwise utilized in any suitable type or form of semiconductor die, and may be manufactured utilizing any suitable semiconductor die and packaging technologies.

Certain words and phrases used in the specification are set forth as follows. As used throughout this document, including the claims, the singular form “a”, “an”, and “the” include plural references unless indicated otherwise. Any of the features and elements described herein may be singular, e.g., a die may refer to one die. The terms “include” and “comprise,” as well as derivatives thereof, mean inclusion without limitation. The phrases “associated with” and “associated therewith,” as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Other definitions of certain words and phrases are provided throughout this disclosure.

The use of ordinals such as first, second, third, etc., does not necessarily imply a ranked sense of order, but rather may only distinguish between multiple instances of an act or a similar structure or material.

Throughout the specification, claims, and drawings, the following terms take the meaning explicitly associated herein, unless the context clearly dictates otherwise. The term “herein” refers to the specification, claims, and drawings associated with the current application. The phrases “in one embodiment,” “in another embodiment,” “in various embodiments,” “in some embodiments,” “in other embodiments,” and other derivatives thereof refer to one or more features, structures, functions, limitations, or characteristics of the present disclosure, and are not limited to the same or different embodiments unless the context clearly dictates otherwise. As used herein, the term “or” is an inclusive “or” operator, and is equivalent to the phrases “A or B, or both” or “A or B or C, or any combination thereof,” and lists with additional elements are similarly treated. The term “based on” is not exclusive and allows for being based on additional features, functions, aspects, or limitations not described, unless the context clearly dictates otherwise. In addition, throughout the specification, the meaning of “a,” “an,” and “the” include singular and plural references.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the present disclosure.

Generally, unless otherwise indicated, the materials for making the invention and/or its components may be selected from appropriate materials such as metal, metallic alloys (high strength alloys, high hardness alloys), composite materials, ceramics, intermetallic compounds, plastic, 3D printable materials, polymers, semiconductor materials, plastic compounds, and the like.

The foregoing description, for purposes of explanation, uses specific nomenclature and formula to provide a thorough understanding of the disclosed embodiments. It should be apparent to those of skill in the art that the specific details are not required in order to practice the invention. The embodiments have been chosen and described to best explain the principles of the disclosed embodiments and its practical application, thereby enabling others of skill in the art to utilize the disclosed embodiments, and various embodiments with various modifications as are suited to the particular use contemplated. Thus, the foregoing disclosure is not intended to be exhaustive or to limit the invention to the precise forms disclosed, and those of skill in the art recognize that many modifications and variations are possible in view of the above teachings.

The terms “top,” “bottom,” “upper,” “lower,” “left,” “right,” and other like derivatives are used only for discussion purposes based on the orientation of the components in the Figures of the present disclosure. These terms are not limiting with respect to the possible orientations explicitly disclosed, implicitly disclosed, or inherently disclosed in the present disclosure and unless the context clearly dictates otherwise, any of the aspects of the embodiments of the disclosure can be arranged in any orientation.

As used herein, the term “substantially” is construed to include an ordinary error range or manufacturing tolerance due to slight differences and variations in manufacturing semiconductor packages. Unless the context clearly dictates otherwise, relative terms such as “approximately,” “substantially,” and other derivatives, when used to describe a value, amount, quantity, or dimension, generally refer to a value, amount, quantity, or dimension that is within plus or minus 5% of the stated value, amount, quantity, or dimension, unless the context clearly dictates otherwise. It is to be further understood that any specific dimensions of components or features provided herein are for illustrative purposes only with reference to the various embodiments described herein, and as such, it is expressly contemplated in the present disclosure to include dimensions that are more or less than the dimensions stated, unless the context clearly dictates otherwise.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the breadth and scope of a disclosed embodiment should not be limited by any of the above-described embodiments, but should be defined only in accordance with the following claims and their equivalents.

The invention claimed is:

1. A device, comprising:

a die having a first surface and a second surface opposite to the first surface;

a first lamination layer on the first surface of the die;

a plurality of openings through the first lamination layer;

a redistribution layer on the first lamination layer, the redistribution layer extending through the plurality of openings to the first surface of the die;

a plurality of studs on the redistribution layer, each of the plurality of studs including a top surface on the redistribution layer, a bottom surface opposite to the top surface, and a sidewall between the first surface and the second surface;

a second lamination layer on the redistribution layer and the first lamination layer;

a plurality of channels in the second lamination layer around the plurality of studs, the bottom surface and at least a portion of the sidewall of each of the plurality of studs being exposed to an external environment through the plurality of channels; and a plating layer on the bottom surface and at least the portion of the sidewall of each of the plurality of studs, wherein at least one of the plurality of channels extends around less than an entirety of a perimeter of a corresponding stud.

2. The device of claim 1, wherein the device further includes:

a molding compound on the second surface of the die and the first lamination layer.

3. The device of claim 1, wherein the plurality of channels extend to the redistribution layer.

4. The device of claim 1, wherein the plurality of channels have a depth that is less than a majority of a height of the sidewall of each of the plurality of studs.

5. The device of claim 1, wherein the plurality of channels have a depth that is greater than a height of the sidewall of each of the plurality of studs.

6. The device of claim 1, wherein the second lamination layer includes an outer surface, the bottom surface of each of the plurality of studs being aligned with the outer surface of the second lamination layer.

7. A package, comprising:

a die having a first surface and a second surface opposite to the first surface;

a redistribution layer on the first surface of the die;

a plurality of conductive extensions on the redistribution layer, each of the plurality of conductive extensions including a top surface on the redistribution layer, a bottom surface opposite to the top surface, and a sidewall between the top surface and the bottom surface;

a lamination layer on the first surface of the die and on at least a portion of the redistribution layer;

an aperture in the lamination layer at an interface between at least one of the plurality of conductive extensions and the lamination layer, the bottom surface; and a plating layer on at least one of the plurality of conductive extensions, wherein:

the plating layer is on the bottom surface and at least a portion of the sidewall of the at least one of the plurality of conductive extensions; and the aperture extends around less than an entirety of a perimeter of the at least one plurality of conductive extensions.

8. The package of claim 7, wherein the aperture has a depth that is more than a height of the sidewall of the at least one of the plurality of conductive extensions.

9. The package of claim 7, wherein the lamination layer includes:

a first lamination layer between the first surface of the die and the redistribution layer; and a second lamination layer on the first lamination layer and on the at least the portion of the redistribution layer, wherein the aperture is in the second lamination layer.

10. A package, comprising:

a die having a first surface and a second surface opposite to the first surface;

a plurality of conductive extensions on the first surface of the die, each of the plurality of conductive extensions including a top surface, a bottom surface, and a sidewall between the top surface and the bottom surface;

a lamination layer on the first surface of the die;

a plurality of channels in the lamination layer, each channel being between the sidewall of a corresponding conductive extension and an internal sidewall of the lamination layer; and a plating layer on the bottom surface and at least a portion of the sidewall of at least one of the plurality of conductive extensions, wherein at least one of the plurality of channels extends around less than an entirety of a perimeter of the corresponding conductive extension.

11. The package of claim 10, wherein the lamination layer includes a plurality of openings, and the package further comprises:

a redistribution layer on the lamination layer and extending through the plurality of openings to the first surface of the die, with each of the plurality of conductive extensions contacting the redistribution layer.

12. The package of claim 11, wherein:

the lamination layer includes a first lamination layer and a second lamination layer;

the first lamination layer is situated between the first surface of the die and the redistribution layer; and the second lamination layer contacts the first lamination layer.

13. The package of claim 10, wherein the lamination layer extends between adjacent channels.

14. The package of claim 10, wherein the channel has a depth that is greater than a majority of a height of the sidewall of the at least one of the plurality of conductive extensions.

15. The package of claim 14, wherein the plating layer is on a majority of the height of the sidewall of the at least one of the plurality of conductive extensions.

* * * * *